(12) United States Patent
Forster

(10) Patent No.: US 7,639,118 B2
(45) Date of Patent: *Dec. 29, 2009

(54) RECEIVER CIRCUIT

(76) Inventor: Ian J Forster, 31 Great Cob, Springfield, Chelmsford (GB) CM1 6AQ ( * ) Notice: Subject to any disclaimer, the term of this patent is extended or adjusted under 35 U.S.C. 154(b) by 0 days.

This patent is subject to a terminal disclaimer.

(21) Appl. No.: 11/434,569

(22) Filed: May 15, 2006

(65) Prior Publication Data

US 2007/0001815 A1  Jan. 4, 2007

Related U.S. Application Data

(63) Continuation of application No. 09/831,128, filed as application No. PCT/GB99/03642 on Nov. 4, 1999, now Pat. No. 7,046,122.

(51) Int. Cl.
*H04Q 5/22* (2006.01)

(52) U.S. Cl. ............. 340/10.33; 340/10.41; 340/10.51; 340/825.69; 340/572.7; 340/14.61

(58) Field of Classification Search ............. 340/10.33, 340/5.6, 825.54, 5.5, 10.1, 10.4, 10.41, 10.51, 340/825.69, 572.7, 14.61; 455/318
See application file for complete search history.

(56) References Cited

U.S. PATENT DOCUMENTS

| 3,983,487 A | 9/1976 | Ohno |
| 4,264,980 A | 4/1981 | Hasler |
| 4,305,074 A * | 12/1981 | Barzana et al. ............. 342/100 |
| 4,393,514 A | 7/1983 | Minakuchi |
| 4,786,903 A | 11/1988 | Grindahl et al. |
| 5,630,216 A | 5/1997 | McEwan |
| 5,710,993 A | 1/1998 | Brekelmans |
| 5,742,902 A | 4/1998 | Shore |
| 6,094,147 A | 7/2000 | Gerz |
| 6,288,629 B1 | 9/2001 | Cofino |

FOREIGN PATENT DOCUMENTS

| EP | 0467036 B1 | 1/1992 |
| EP | 0871042 B1 | 10/1998 |
| GB | 2284323 A | 5/1995 |

* cited by examiner

*Primary Examiner*—Vernal U Brown
(74) *Attorney, Agent, or Firm*—Christensen O'Connor Johnson Kindness PLLC

(57) ABSTRACT

A detector receiver circuit (2) for use as a wake-up detector for detecting an amplitude modulated carrier signal is described. The circuit (2) comprises: an antenna (4) for receiving the modulated carrier signal; a transistor (10), such as an FET, is connected to the antenna (4) and configured to operate as a detector of modulation of the carrier frequency. The circuit further comprises a resonator circuit (12-16) which is also connected to the transistor and configured such that the transistor (10) can simultaneously oscillate at substantially the modulation frequency; an oscillator quenching means (20) for periodically quenching oscillation of the transistor (10) and means (26, 28, 30) for sensing the characteristics of the build-up of oscillation to indicate the presence of a modulated carrier signal. How quickly the magnitude of oscillation of the transistor (10) builds up is dependent on whether the antenna is receiving a carrier signal which is modulated at the frequency of self-oscillation of the transistor and this is utilized to detect for the presence of a valid wake-up signal.

23 Claims, 2 Drawing Sheets

Figure 1:
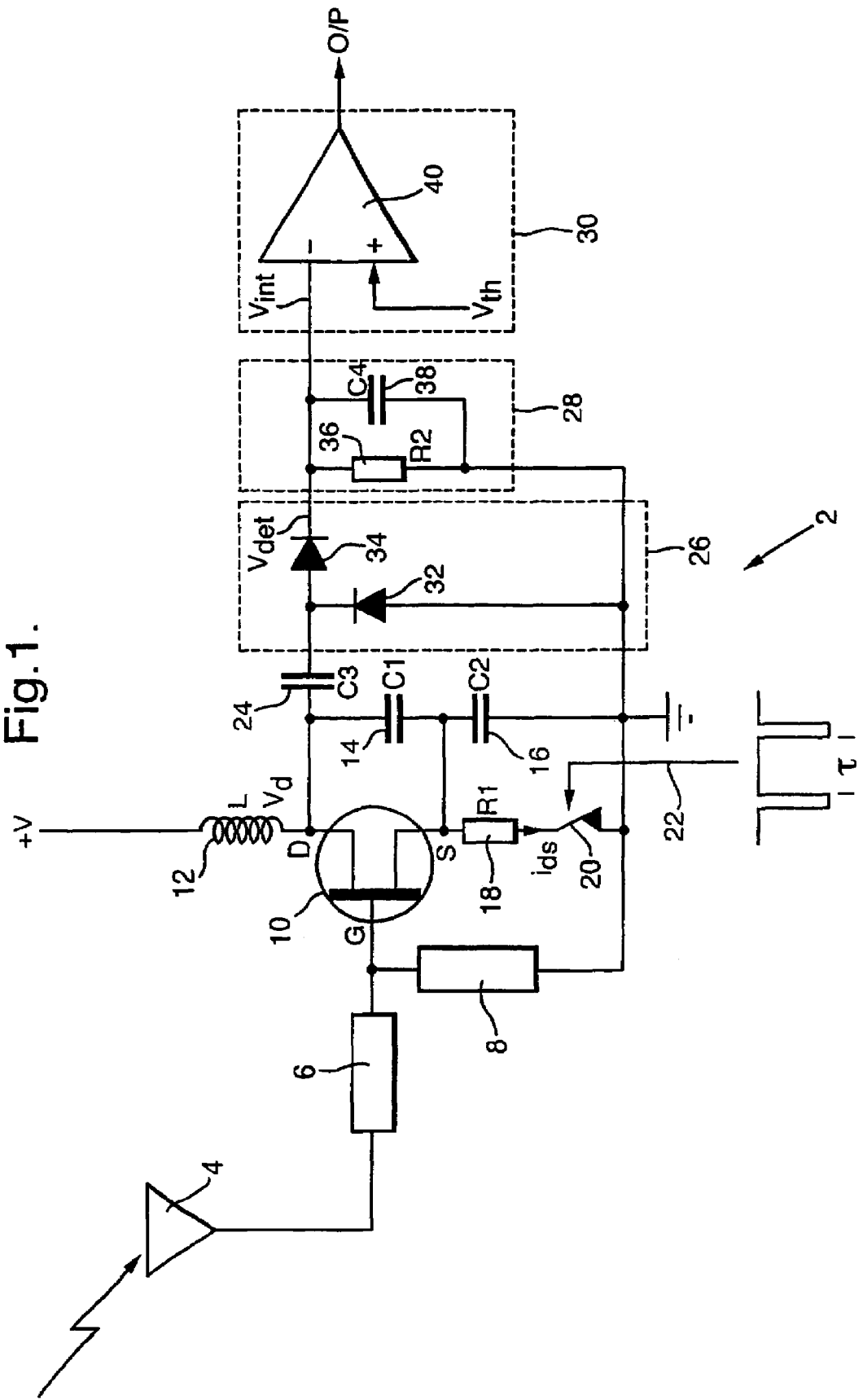

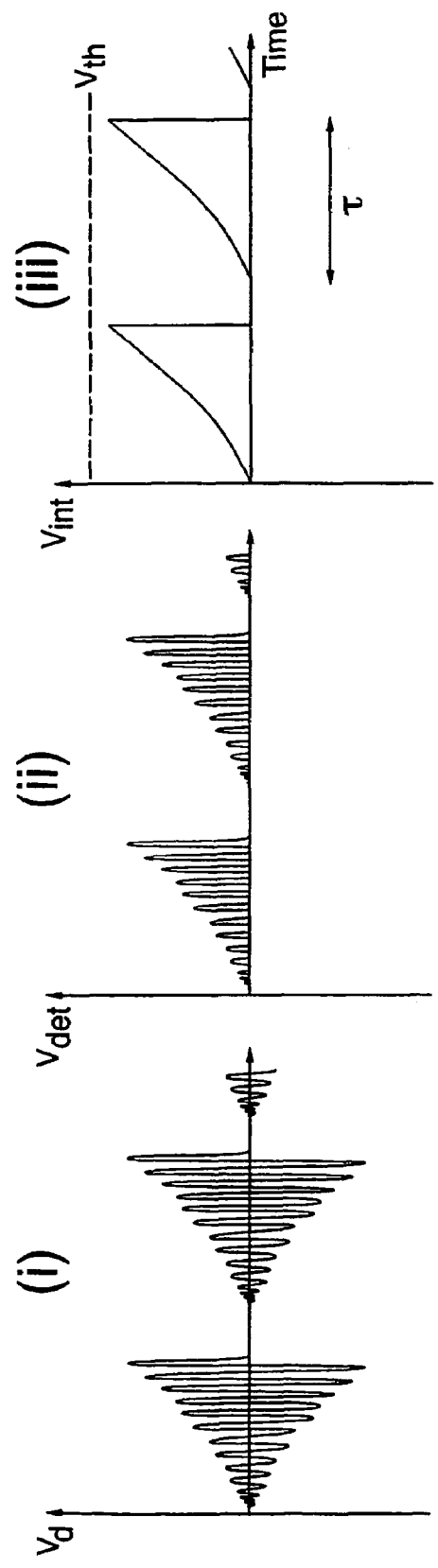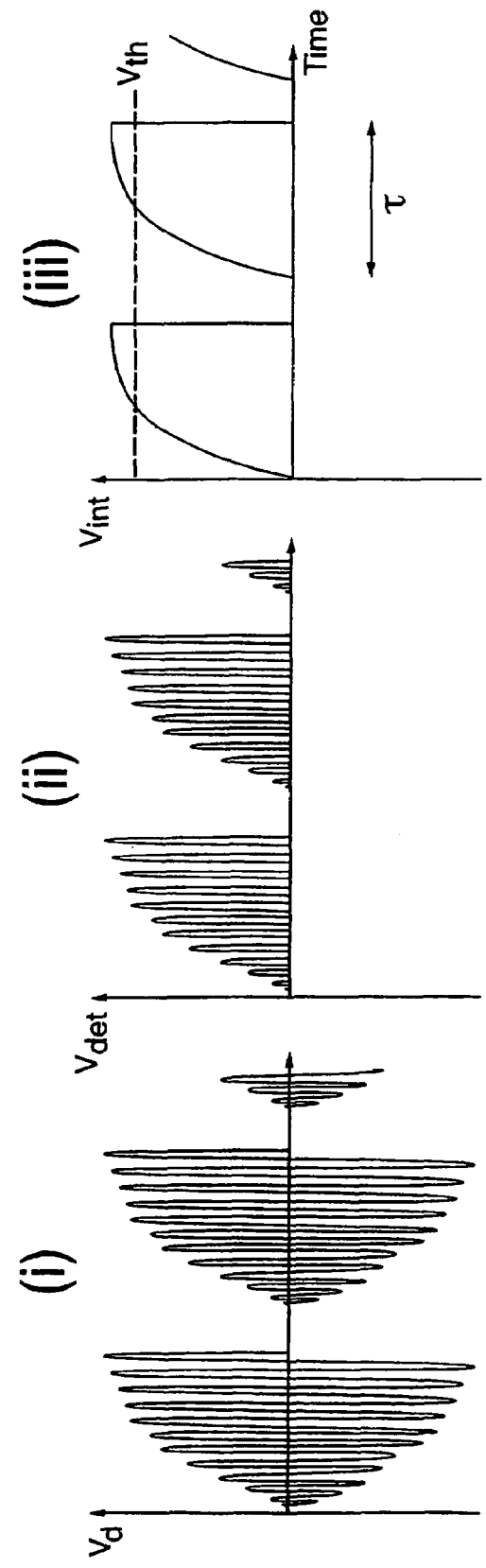
Fig.2(a).
Fig.2(b).

RECEIVER CIRCUIT

This invention relates to a receiver circuit and more especially, although not exclusively, to such a receiver circuit for use as a "wake-up" detector for a tag.

Tagging systems are well known and generally comprise at least one interrogator circuit which is connected to a control centre by means of a telecommunications network and a number of tags, which include a transponder circuit, with which the interrogator circuit can communicate typically by means of radio transmission. Generally, an interrogator circuit is at a fixed location whilst the tags are attached to objects which are mobile. The applications for tagging systems are numerous and include road tolling systems; remote reading of utility meters such as electricity, water or gas consumption meters; telematics (that is communication between an infrastructure and vehicles) and logistics (that is keeping track of the movement of goods such as food between a warehouse and a number of retail outlets) to name but a few.

In a number of applications, the tag will be inoperative for a significant proportion of the time. For example, the tag may only be required to communicate with the interrogator for a few minutes, or even seconds, over a period of many months or even years. To reduce the power consumption of the tag and hence increase the operating life of the tag, which will often be operated from a battery supply, it has been proposed that the tag has a second mode of operation, often termed a "sleep" mode or low current state. In this low current state the power consumption of the tag is kept to a minimum by switching off all non-essential circuitry. The tag is re-activated or awoken from its "sleep" state when it detects a recognised signal, often termed a "wake-up" signal, from the interrogating source. For tags which operate at microwave frequencies it is known for the wake-up signal to be in the form an amplitude modulated (AM) microwave signal. The detector modulator circuit of the tag's transponder circuit will act as an efficient microwave detector at very low bias currents, even of the order of a few micro-amps, enabling detection of the wake-up signal. However, the tag will often include additional circuitry such as a microprocessor which is required to operate at a logic level of the order of a few volts. In order to convert the very low detected microwave signal to an appropriate level to activate a microprocessor, it is known to use an amplifier and comparator between the detector and the microprocessor. Depending on the frequency of the wake-up signal, the amplifier and comparator can consume a significant amount of electrical power, of the order of 50 µA, and these components can represent a significant part of the overall cost of the tag.

For tagging systems in which a slow wake-up is acceptable, a low frequency wake-up signal can be used. In such systems it is possible to use an amplifier which has an adequate gain bandwidth product and which is able to operate at very low currents, (of the order of 5 µA). Such amplifiers however tend to be prohibitively expensive in many applications. Conversely for systems in which a fast wake-up response is required or for systems where a low frequency wake-up tone is not available or viable, such as those based on emerging standards for telematics, the required gain bandwidth product of the amplifier results in a circuit which has a significant power consumption (of the order of 50 µA). Combined with the significant cost of these amplifiers this type of circuit virtually rules out long life operation from a battery.

The use of wake-up detectors is also known in applications other than tagging systems such as for example in the handsets of cellular telephones or in digital cordless telephones. Whilst for such applications cost is not such an overriding issue an inexpensive detector receiver circuit could be of benefit. A need exists therefore for a receiver circuit which is both inexpensive and which has a low power consumption.

The present invention has arisen in an endeavour to provide a receiver circuit which can be used as a wake-up detector and which at least in part overcomes the problems of the known arrangements.

According to the present invention a receiver circuit comprises: an antenna for receiving a modulated carrier signal; a transistor connected to the antenna and configured to operate as a detector of modulation of the carrier signal; a resonator circuit connected to the transistor and configured such that the transistor can simultaneously self-oscillate at substantially the modulation frequency; an oscillator quenching means for periodically quenching self-oscillation of the transistor and means for sensing the characteristics of the build-up of oscillation to indicate the presence of a modulated carrier signal.

How quickly the magnitude of oscillation of the transistor builds up is determined by whether the antenna is receiving a carrier signal which is modulated at the selected modulation frequency. It will be appreciated therefore that the transistor simultaneously operates as a detector of the modulation of the carrier and as a super-regenerative receiver at the modulation frequency of this carrier. By configuring the transistor to simultaneously operate in the two modes of operation, the circuit thus provides an extremely sensitive receiver circuit which is both inexpensive and has a very low power consumption.

In one arrangement of the circuit, the oscillator quenching means quenches oscillation of the transistor when the magnitude of oscillation reaches a selected magnitude and the means for sensing measures the time between quenching of the transistor to indicate the presence of a modulated carrier signal. For example, when the circuit receives a carrier signal modulated at, or substantially the same as, the frequency of self-oscillation of the circuit, the time taken to reach the selected magnitude will decrease and this can be detected as an increase in the quenching frequency. Preferably the selected magnitude is the point at which oscillator compression of the transistor occurs, that is the point at which saturation of the amplitude of the oscillation of the transistor occurs.

In an alternative embodiment, the oscillator quenching means quenches oscillation of the transistor at regular time intervals and the means for sensing measures the magnitude of oscillation over one or more of the time intervals to indicate the presence of a modulated carrier signal. Conveniently the time interval is selected such that in the absence of a modulated signal the magnitude of oscillation will not reach a selected threshold value and will exceed this threshold when a modulated carrier signal is present. Alternatively the average magnitude of oscillation over one or more time intervals can be used to indicate the presence of a modulated carrier signal.

In a particularly preferred embodiment, which is for use at microwave frequencies, the transistor comprises a field effect transistor (FET) and the oscillator quenching means, which conveniently comprises a switching means, quenches oscillation of the transistor by varying the drain source current of the FET. Conveniently with such a circuit, the resonator circuit comprises a ceramic resonator, a quartz crystal or a network of one or more capacitors and inductors. Since all of these components are essentially passive elements, this ensures the circuit remains simple and inexpensive to manufacture. Advantageously, the receiver circuit further comprises a matching network between the antenna and the transistor. To enable the circuit to operate with a frequency modulated (FM) or phase modulated carrier signal, the circuit further comprises a narrow band filter for converting the frequency/phase modulated signal to an amplitude modulated signal before it is applied to the input of the transistor.

According to a further aspect of the invention, a wake-up detector circuit includes a receiver circuit as described above.

In order that the invention may be further understood, an embodiment thereof will now be described by way of example only with reference to the accompanying drawings in which:

FIG. 1 is a schematic of a receiver circuit in accordance with the invention; and FIG. 2 is a representation of the voltage (i) $v_d$ at the drain d of field effect transistor, (ii) $v_{det}$ at the detector's output and (iii) $v_{int}$ at the output of the integrator versus time for the circuit of FIG. 1, (a) in the absence of a modulated signal and (b) when the antenna receives a modulated signal.

Referring to FIG. 1, there is shown a receiver or wake-up circuit 2 in accordance with the invention for operation with a carrier frequency of 2.45 GHz. The circuit 2 comprises a patch antenna 4 which is connected by means of a radio frequency (rf) matching network 6, 8 to the gate g of a field effect transistor (FET) 10. In the example shown the FET 10 is a gallium arsenide FET, ATF21186A. The matching network 6, 8 comprises a microstrip line arrangement which matches the input impedance of the FET 10 to that of the antenna 4 and provides a dc/low frequency ground for the gate g of the FET 10. The matching network is configured such that the FET 10 will operate as a receiver at 2.45 GHz.

A resonator circuit which comprises a serially connected inductor 12 (L) and two capacitors 14 ($C_1$) and 16 ($C_2$) is provided between the positive supply rail +V and earth with the node between the inductor 12 and capacitor 14 being connected to the drain d of the FET 10 and the node between the two capacitors 14 and 16 being connected to the source s of the FET 10. The values of the inductor 12 and capacitors 14 and 16 are selected such that the FET 10 will self-oscillate at a selected frequency; in the example described, 100 kHz. The selected frequency, which will be termed the wake-up frequency, corresponds to the expected frequency of modulation of the 2.45 GHz carrier signal. The modulated signal will be termed the wake-up signal.

Between the source of the FET 10 and ground there is provided a serially connected resistor 18 ($R_1$) and switch 20. The resistor 18 sets the dc operating conditions of the FET 10 and its value is selected such that when the switch is "closed" the FET 10 operates as a negative resistance. In such a condition the gain of the FET 10 exceeds the loss resistance of the tuned resonator circuit 12, 14, 16 and the transistor self-oscillates. The state of the switch 20, that is whether it is "open" or "closed" circuit, is controlled by a control input 22 to which a pulsed signal of time period τ is applied. The switch 20 thus controls the current $i_{ds}$ flowing between the drain and source of the FET 10 and hence whether the transistor can self-oscillate.

Connected to the drain of the FET 10 via a coupling capacitor 24 ($C_3$) are a serially connected detector circuit 26, an integrator circuit 28 and a threshold detector circuit 30. As is known the coupling capacitor 24 allows high frequency signals to pass whilst ensuring the detector circuit 26 does not affect the DC bias conditions of the FET 10.

As shown, the detector circuit 26 is a voltage doubling diode detector comprising two Schottky diodes 32 and 34; the integrator circuit 28 consists of a parallel connected resistor 36 ($R_2$) and capacitor 38 ($C_4$) and the threshold detector 30 consists of a voltage comparator 40 for comparing the voltage $v_{int}$ at the output of the integrator 28 with a threshold voltage $V_{th}$. The values of the resistor 36 and capacitor 38 are selected to ensure the time constant of the integrator is such that it produces the envelope of the voltage $V_{det}$ appearing at the output of the detector 26.

As described the FET 10 is configured by the matching circuit 6 and 8 to operate as a receiver at 2.45 GHz and is simultaneously configured by the series resonator circuit 14, 16 and 18 to operate as an oscillator at the 100 kHz modulation frequency. In operation, oscillation of the transistor is quenched periodically by quenching the drain/source current $i_{ds}$ whenever the switch 20 is open circuit and the circuit is allowed to restart oscillating for time interval τ. The time taken for the magnitude of oscillation to build up once it has been quenched is dependent on the Q factor of the tuned resonator circuit 12, 14, 16, the gain of the FET 10 and, most importantly, whether a modulated carrier signal is present at the gate g of the FET 10.

Referring to FIG. 2(a)i-iii these figures show the voltage appearing at various points in the circuit in the absence of a wake-up signal. From FIG. 2(a)i it will be seen how the voltage $v_d$ appearing at the drain d builds up as the transistor begins to self-oscillate. After a period of time τ the switch 20 opens and oscillation of the transistor is quenched. After a short period the switch is closed for a further time period τ and the transistor begins to self oscillate once more before being quenched and this process is repeated. Referring to FIGS. 2(a) ii and iii, these show the corresponding rectified voltage $v_{det}$ at the output of the detector circuit 26 and the voltage $v_{int}$ at the output of the integrator 28, the latter of which corresponds to the envelope the voltage $v_{int}$. The time period τ and/or the Q factor of the tuned resonator circuit are selected such that in the absence of a wake-up signal the voltage $v_{int}$ is always less than the threshold voltage $V_{th}$.

Referring to FIG. 2(b)I-iii these show the equivalent voltage plots for the case when the circuit 2 receives a wake-up signal at the antenna 4. As will be apparent the magnitude of oscillation builds up much more rapidly and the voltage $v_{int}$ soon exceeds the threshold voltage $V_{th}$ causing the output of the voltage comparator 40 to change state indicating the detection of a wake-up signal. The output from the voltage comparator can be used directly to re-activate circuitry, such as a microprocessor, which has been previously set into a sleep state to reduce power consumption. Having detected a valid wake-up signal, the circuit 2 can be readily re-configured to operate as the transponder circuit of a tag by switching the resonator circuit 12, 14, 16 out of the circuit 2 and changing the drain/source current as for example is described in our UK Patent No GB 2284323.

It will be appreciated therefore that the FET 10 functions as a low frequency (100 kHz) super-regenerative receiver of amplitude modulation of a microwave (2.4 Ghz) signal. It is found that the circuit 2 described is capable of operation at extremely low currents, of the order of two microamps, but is still able to produce a large output change which can be used to directly drive logic circuits. Furthermore the circuit is also inexpensive since the transistor is configured to operate as both a microwave detector and an oscillator at the modulation frequency. The circuit thus allows a low power wake-up detector to be produced which is capable of operating with relatively high modulated frequency wake-up signals with a very high degree of sensitivity. The nature of the circuit configuration is such that it has an inherent filtering effect which reduces false wake-up events.

It will be appreciated that modifications to the circuit illustrated may be made within the scope of the present invention. For example, in the embodiment illustrated, oscillation of the transistor is quenched at regular intervals and the threshold detector circuit determines when a modulated signal is present when the magnitude of oscillation exceeds the threshold voltage within a given time interval. In a further embodiment of the invention the time constant of the integrator is selected such that the voltage is integrated over a number of time intervals to give a measure of the average value of the magnitude of oscillation. Such an arrangement provides an even higher noise immunity and tolerance to false triggering though the wake-up time will accordingly be increased. In yet a further embodiment oscillation of the transistor is quenched whenever it reaches a selected magnitude of oscillation and the time between quenching events is used to detect for the presence of the selected wake-up signal. In all embodiments the characteristics of the build-up of oscillation is used to indicate the presence of a modulated carrier signal.

It will be further appreciated that the invention is not limited to the specific circuit arrangement described. For example, in an alternative embodiment the integrator and threshold detector 30 could be replaced with a Schmitt logic gate in which the threshold voltage corresponds to the logic level of the gate. With such an arrangement the logic gate will produce a clocked output, at the modulation required, which can be used to clock a microprocessor or other control circuitry. Once a valid wake-up signal is detected, the processor then inhibits quenching of the transistor and the circuit will continue to provide a clock signal whilst a modulated carrier signal is being received. A particular advantage of this arrangement is that the microprocessor can be clocked externally without the need of an internal clock.

In further embodiments of the invention, the series resonator circuit can be replaced with a low frequency crystal which would very precisely set the frequency oscillation of the circuit and give even better sensitivity or with a ceramic resonator or other forms of resonator circuits which comprise one or more capacitors and inductors. Depending on the frequency of operation, the FET 10 could be replaced with other types of transistors such as bipolar devices and likewise the patch antenna by an antenna appropriate to the desired frequency of operation. The term transistor is intended to have a broad meaning and include both discrete devices an those that are a part of a larger integrated circuit.

Furthermore, whilst the receiver circuit 2 has been described in relation to a wake-up detector for a tag, the circuit can be used in other applications. One example is to use it in the handset of a digital cordless telephone which uses burst mode transmission such as Time Division Multiple Access (IDMA). In such an application the transistor is tuned to operate as a receiver at the carrier frequency and is configured to self-oscillate at the frequency of the bursts (i.e. the reciprocal of the time interval between bursts). The present invention thus provides a very low power receiver circuit which has a fast response and which can detect high frequency burst mode signal such as for example those used in cellular telephones. One further example of an application of the invention is in the detection of TDMA signals particularly those from cellular phones in areas, such as railway carriages, where the use of such equipment is prohibited. Furthermore it will be appreciated that the circuit is also suited to use with a frequency or phase modulated carrier signals provided a narrow band filter is used to convert the received signal to an AM modulated signal before it is applied to the input of the transistor.

The invention claimed is:

1. A receiver circuit for detection of a modulated signal, comprising:
    an antenna configured to receive a modulated carrier signal having a modulation frequency;
    a transistor configured to receive the modulated carrier signal at its gate;
    a resonator circuit coupled to the transistor and configured to cause the transistor to oscillate at a predetermined oscillation frequency and to produce an oscillation signal having a magnitude that increases at a rate that is faster in the presence of the modulated carrier signal than in the absence of the modulated carrier signal;
    an oscillation quenching circuit configured to periodically quench oscillation of the transistor and to allow oscillation of the transistor for a time period that is less than required for the oscillation signal to reach a predetermined threshold in the absence of the modulated carrier signal; and
    an oscillation sensing circuit coupled to the transistor to receive the oscillation signal from the transistor and to sense if the oscillation signal reaches the predetermined threshold within the time period to indicate the presence of the modulated carrier signal having the modulation frequency.

2. The circuit of claim 1, wherein the oscillation sensing circuit includes:
    an integration module configured to integrate the oscillation signal and generate a signal peak; and
    a comparison module configured to detect the presence of the modulated carrier signal when the signal peak reaches the predetermined threshold.

3. The circuit of claim 2, further comprising a rectification module coupled to the transistor and configured to produce a rectified output that is provided to the integration module.

4. The circuit of claim 2, wherein the oscillation quenching circuit comprises a switch coupled to the transistor, and wherein the switch is configured to quench an oscillation of the transistor when the switch is open.

5. A method for detection of a modulated signal, comprising:
    receiving a modulated carrier signal having a modulation frequency;
    generating an intermediate signal at a frequency substantially equal to the modulation frequency, wherein the intermediate signal has a magnitude that increases faster when a modulated carrier signal is being received than when the modulated carrier signal is not being received;
    integrating the intermediate signal to generate a signal peak over a time period that is less than a time period required for the intermediate signal to reach a predetermined threshold in the absence of the modulated carrier signal;
    periodically quenching the intermediate signal; and
    determining if the signal peak reaches the predetermined threshold within the time period when the intermediate signal is being integrated to detect the presence of the modulated carrier signal.

6. The method of claim 5, wherein the modulated carrier signal is a wakeup signal.

7. The method of claim 5, wherein the modulated carrier signal is an amplitude-modulated carrier signal.

8. The method of claim 5, wherein said generating an intermediate signal comprises providing the modulated carrier signal to a transistor that is configured to oscillate at substantially the modulation frequency.

9. The method of claim 8, wherein the intermediate signal is quenched by selectively opening a switch that is configured to control current flow through the transistor.

10. The method of claim 8, further comprising rectifying the output of the transistor to generate a rectified output as the intermediate signal.

11. A system for detection of a wake-up signal, comprising:
an antenna configured to receive a modulated wake-up signal having a modulation frequency;
a transistor configured to receive the modulated wake-up signal at its gate;
an oscillation module configured to generate an intermediate signal at a frequency substantially equal to the modulation frequency, wherein the intermediate signal has a magnitude that increases at a rate that is faster in the presence of the modulated wake-up signal at the gate of the transistor than in the absence of the modulated wake-up signal at the gate of the transistor;
an oscillation quenching module configured to quench the intermediate signal generated by the oscillation module when a magnitude of the intermediate signal reaches a threshold; and
an output module configured to generate an output signal for activating a processor when an amount of time between quenching of the intermediate signal indicates the presence of a modulated wake-up signal.

12. The system of claim 11, further comprising an integration module coupled to the oscillation module and configured to integrate the intermediate signal and generate a signal peak, wherein the output module is further configured to generate the output signal when the signal peak reaches the threshold.

13. The system of claim 12, wherein the antenna, oscillation module, integration module, oscillation quenching module, and output module are operable within a transponder.

14. The system of claim 11, wherein the oscillation quenching module comprises a switch that is coupled to the transistor and configured to control an oscillation of the transistor.

15. The system of claim 14, wherein the switch, when open, is configured to quench the oscillation of the transistor.

16. A method for detection of a modulated signal, comprising:
receiving a modulated carrier signal having a modulation frequency;
generating an intermediate signal at a frequency substantially equal to the modulation frequency, wherein the intermediate signal has a magnitude that increases at a rate that is faster when the modulated carrier signal is being received than when the modulated carrier signal is not being received;
integrating the intermediate signal;
quenching the intermediate signal when a magnitude of the integrated intermediate signal reaches a threshold; and
detecting the modulated carrier signal based on a time interval between quenching of the intermediate signal.

17. The method of claim 16, wherein the modulated carrier signal is a wake-up signal.

18. The method of claim 16, wherein the modulated carrier signal is an amplitude-modulated carrier signal.

19. The method of claim 16, wherein said generating an intermediate signal comprises providing the modulated carrier signal to a transistor that is configured to oscillate at substantially the modulation frequency.

20. The method of claim 19, wherein said quenching the intermediate signal comprises opening a switch that is configured to control current flow through the transistor to quench the oscillation of the transistor.

21. The method of claim 19, wherein the transistor is coupled to at least one inductor and to one capacitor configured to cause the transistor to oscillate.

22. The method of claim 19, further comprising rectifying the output of the transistor to generate a rectified output as the intermediate signal.

23. The method of claim 22, wherein said integrating the intermediate signal comprises integrating the rectified output using an integrator circuit.

* * * * *